(12) United States Patent
Lee et al.

(10) Patent No.: US 6,362,757 B1
(45) Date of Patent: Mar. 26, 2002

(54) METHOD AND APPARATUS FOR ENCODING MB810 LINE CODE WITH THE CHARACTERISTICS OF MINIMUM BANDWIDTH AND DC-FREE

(75) Inventors: Changoo Lee; Dae Young Kim; Jung Whan Kim; Hae Won Jung; Hyeong Ho Lee, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/474,398

(22) Filed: Dec. 29, 1999

(30) Foreign Application Priority Data

Aug. 20, 1999 (KR) .............................. 99-34713

(51) Int. Cl.[7] .............................................. H03M 7/20
(52) U.S. Cl. ............................ 341/102; 341/59; 341/67
(58) Field of Search ........................ 341/102, 67, 100, 341/101, 106, 58, 59, 60, 61, 81, 95

(56) References Cited

U.S. PATENT DOCUMENTS

| | | | |
|---|---|---|---|
| 4,486,739 A | | 12/1984 | Franaszek et al. ... 340/347 DD |
| 4,760,378 A | * | 7/1988 | Iketani et al. ........ 340/347 DD |
| 4,864,303 A | * | 9/1989 | Ofek ............................ 341/59 |
| 5,022,051 A | | 6/1991 | Crandall et al. ............... 375/19 |
| 5,396,239 A | | 3/1995 | McMahon et al. ............ 341/58 |
| 5,739,779 A | * | 4/1998 | Kunisa et al. ................. 341/59 |
| 5,809,081 A | * | 9/1998 | Karabed et al. ............. 345/263 |

OTHER PUBLICATIONS

Muñoz–Rodriguez, E. and J. B. Arevalo–Galarza, "Line Coding For Very High Speed LANS," *Electron. Letters* 26(24):2051–2053, 1990.

Lin, Yinyi and Pi–Hai Liu, "Charge–Constrained (0, *G/I*; *C*) Sequences," *IEEE Trans. On Communications* 45(10):1183–1191, 1997.

Deliot, E. and A. N. Coles, "New Class of 2 p)B(2p+1)B DC Balanced Line Codes," *Electronics Letters* 34(10):981–982, 1998.

Lee et al., "A New Line Code MB810 for 10GbE" (Slide Presentation), *IEEE 802.3–99*, 1999.

* cited by examiner

*Primary Examiner*—Brian Young
*Assistant Examiner*—John Nguyen
(74) *Attorney, Agent, or Firm*—SEED IP Law Group, PLLC

(57) ABSTRACT

A coding method for converting m-bit input data into n-bit codeword satisfying DC-free and minimum bandwidth characteristics that includes the following: Select the number of input bits m and the number of output bits n for an (m,n) block code. Accumulate a sufficient number of BUDA (binary unit DSV and ASV) cells to form a BUDA stack for derivation of the state diagram. Pick one node as a state, and secure at least $2^m$ exit paths of an n-hop length, and denote each terminating node of each path as another state. Start with a new state and repeat the previous step. If the stack needs to be expanded to complete the state diagram, add more cells to the stack either horizontally or vertically as appropriate. Reduce the number of states as possible with all transition paths terminating on one of the arranged states. At each state, arrange the mapping table as an input m-bit combination to an output n-bit combination. As necessary, plot the power spectrum of the coded sequence with varying input bit probability, and choose the mapping that generates the most desirable power spectral properties.

14 Claims, 6 Drawing Sheets

METHOD AND APPARATUS FOR ENCODING MB810 LINE CODE WITH THE CHARACTERISTICS OF MINIMUM BANDWIDTH AND DC-FREE

TECHNICAL FIELD

The present invention pertains to a method and apparatus for encoding line code, and more particularly, to producing a run length limit MB810 line code that is DC free.

BACKGROUND OF THE INVENTION

The primary purpose of line codes is to transform the frequency spectrum of a serial data stream so as to adapt the signal spectrum more closely to specific channel requirements. The code must also provide special characters outside the data alphabet for functions such as character synchronization, frame delimiters, and perhaps for abort, reset, idle, diagnostics, etc. In most cases a reduction in bandwidth by constraints on both the high and the low frequency components is desirable to reduce distortion in the transmission media, especially electromagnetic cables, or in the band limited receiver, and to reduce the effects of extrinsic and intrinsic noise.

Another aspect of codes is their interaction with noise and errors in the line digits. The redundancy associated with line codes can be used to supplement other error detection mechanisms or to monitor the quality of the channel with a minimal amount of circuitry.

Such codes generally exhibit the undesirable feature of enlarging error bursts in the decoded data, making detection by a cyclic redundancy check more difficult. A good transmission code should minimize these effects.

For fiber optic links and intra-establishment wire links, interest centers for many reasons on the family of two-level codes, called binary. Being binary, such codes fit nicely with optical channels suffering from nonlinearity, which cannot be perfectly eliminated in practiced engineering. Being binary, they offer the maximum receive signal-to-noise ratio (SNR) for the same given conditions, e.g., transmit optical power and optical span, compared to other multi-level codes.

For wire links one prefers codes with no DC and little low frequency content in order to DC isolate the transmission line from the driver and receiver circuitry, usually by transformers, and to reduce signal distortion on the line. Although these factors do not apply to the fiber optic case, good low frequency characteristics of the code are helpful for a number of reasons.

High-gain fiber-optic receivers need an AC coupling stage near the front end. The control of the drive level, receiver-gain, and equalization is simplified and the precision of control is improved, if it can be based on the average signal power, especially at top rates. DC restore circuits tend to lose precision with rising data rates and cease to operate properly below the maximum rates for other circuits required in a transceiver. If the time constants associated with the parasitic capacitance at the front end of a receiver are comparable to or longer than a baud interval, a signal with reduced low frequency content will suffer less distortion and will enable many links to operate without an equalizing circuit.

By block coding, they can be made inherently run-length limited (RLL). They can be easily made to be dc-free. By block coding, it is easy to provide for extra control symbols.

In spite of all these advantages, a major concern playing against adopting the block coding is the fact that it usually requires more channel bandwidth than other choices due to the increased line rate. When using 8B/10B, for example, the main-lobe bandwidth, i.e., the bandwidth to the first power spectral null, is 12.5 GHz, 25% more than with uncoded binary input data.

Design of such a code, called minimum-bandwidth (MB) code, has been possible by making novel use of a theorem. The theorem establishes a condition for a digital signaling system to operate within the theoretical minimum-bandwidth dictated by Nyquist, hence usually called the Nyquist bandwidth, which is, by definition, half the signaling frequency. With most usual non-MB codes including Binary and 8B/10B, the line bandwidth is as wide as the signaling frequency.

The DC components of conventional codes that are infinite with its run-length, for example, scrambled NRZ, cause baseline wander of signals while they pass through an ac-coupled channel in high-speed communication network. In addition, the conventional codes require at least two times or more of Nyquist bandwidth. Therefore, in respect of transmission efficiency, the conventional codes are inferior.

The code disclosed by U.S. Pat. No. 5,022,051, "DC-free line code for arbitrary data transmission" removes DC components in the coded data by maintaining the same number of ones and zeros within a certain period. However, the required bandwidth is two times the Nyquist bandwidth.

The code disclosed by U.S. Pat. No. 5,396,239, "Data and forward error control coding techniques for digital signals" restricts run-length, and thus the DC component is reduced. However, it also needs two times the Nyquist bandwidth.

The code disclosed by U.S. Pat. No. 4,486,739, "Byte oriented DC balanced (0,4) 8B/10B partitioned block transmission code" converts an 8 bit input data into a 10 bit codeword so as to reduce DC component of the codeword. However, bandwidth of the coded data occupies two times the Nyquist bandwidth.

In "Line coding for very high speed LANs", an 8 bit input data is divided into two 4 bit groups and encode them. It claims that the coding method provides a DC-free characteristic and simple implementation. However, it only provides a DC-free characteristic, not minimum bandwidth.

In "charge constrained (0,G/I,C) sequences", run-length is limited and therefore the code has a DC-free characteristic. However, it only provides a DC-free characteristic, not minimum bandwidth.

In "New class of (2p)B(2p+1)B DC balanced line codes", disparity is restricted while coding is performed and therefore the code provides a DC-free characteristic. However, it only provides a DC-free characteristic, not minimum bandwidth.

Since the above mentioned conventional codes are only DC-free and not minimum bandwidth, the transmission efficiency in a band limited channel is decreased by a factor of two. Hence, there is a need for DC-free and minimum bandwidth characteristics to improve transmission performance and efficiency, such as is desired in high-speed networks.

SUMMARY OF THE INVENTION

The disclosed embodiments of the present invention provide a coding system that includes a method and apparatus for producing a run-length limited MB810 code.

In accordance with another aspect of the disclosed embodiment, such a coding system produces code that is DC-free and capable of operating within the theoretical Nyquist bandwidth for an MB810 code. This means the code is near optimum for run length, digital sum variation (DSV), and alternate sum variation (ASV) for an MB810 code.

The disclosed embodiments also provide such a coding system wherein each 8 bit input block is converted into 10 bit output codeword.

In accordance with a further aspect of the disclosed embodiments, the coding is performed by hardwire only to provide a wire-speed in encoding and decoding.

The foregoing features and advantages of the present invention are realized by utilizing a coding method for MB810 that converts 8-bit input data into 10-bit codeword, the codeword satisfying DC-free and minimum bandwidth characteristics.

The procedural steps of a general design method for MBmn line code can be summarized as follows:

Step 1: Select the number of input bits m and the number of output bits n for an (m,n) block code. In one embodiment, n should be an even number; a binary MBmn code of an odd value of n is found to be impossible. Preferably m is n−1 for minimal redundancy. In the disclosed embodiment, a code design with m equal to n−1 is impossible. In that case, m equal to n−2 will be taken.

Step 2: Accumulate a sufficient number of BUDA (binary unit DSV and ASV) cell, as shown in FIG. 1, to form a BUDA stack for derivation of the state diagram. Note that stacking cells horizontally would increase the DSV value. Doing so vertically would increase the ASV value. Therefore, where to add additionally needed cells will depend on the design preference for the two spectral properties.

Step 3: Pick one node as a state, and secure at least $2^m$ exit paths of an n-hop length. Denote each terminating node of each path as another state.

Step 4: Start with a new state and repeat the previous step. Paths on already existing state nodes should be terminated and generating new states should be avoided as far as possible.

Step 5: If it turns out that the stack needs to be expanded to complete the state diagram, add more cells to the stack either horizontally or vertically as appropriate.

Step 6: Reduce the number of states as possible with all transition paths terminating on one of the arranged states. If this trial succeeds, then the stack design is complete.

Step 7: At each state, arrange the mapping table as an input m-bit combination to an output n-bit combination. The result is the state transition table or codebook. Use the same mapping as far as possible across states to reduce the implementation complexity. This will also tend to simplify the decoding rule.

Step 8: If necessary, plot the power spectrum of the coded sequence with varying input bit probability, and choose the mapping that would generate the most desirable power spectral properties. Some of the criteria for desirable power spectral properties include the smoothness of the spectral envelope with the least spectral spikes and the symmetry of the spectral envelope across the whole frequency band of interest.

If all these steps are done successfully, then the code design itself is done with success.

BRIEF DESCRIPTION OF THE DRAWINGS AND TABLES

The embodiments of the present invention will be explained with reference to the accompanying drawings, in which.

DETAILED DESCRIPTION OF THE PREFERRED EMBODIMENTS

1. THEORETICAL BACKGROUND OF THE CODING CONCEPTS AND DESIGN

Figure 1:
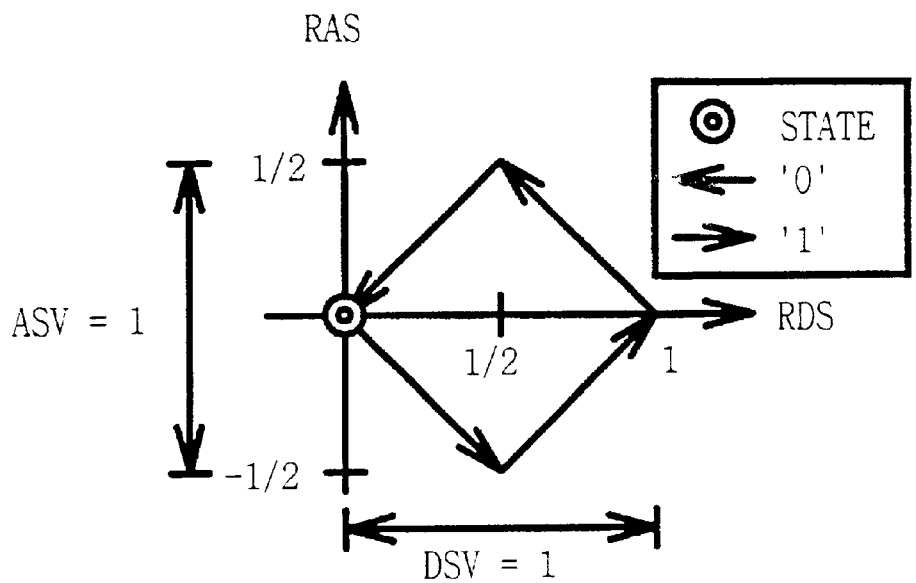
FIG. 1 shows a diagram for illustrating a binary unit DSV and ASV (BUDA) cell.

Assume the line coder outputs a symbol every T seconds, and let $Y_n$ denote the coder output symbol at t=nT. Then consider a code parameter called running alternate sum (RAS):

$$RAS = \sum_{n=I}^{J} (-1)^n Y_n, \qquad [\text{Equation 1}]$$

where I and J are integers. RAS is the sum of the coded output symbols within an arbitrary interval between t=IT and t=JT, yet modified with alternating polarity. Then further consider an associated code parameter called alternating sum variation(ASV) defined as $$ASV = \max_{I,J,\{Y_n\}} \left| \sum_{n=I}^{J} (-1)^n Y_n \right| \qquad [\text{Equation 2}]$$

That is, ASV is the peak-to-peak variation of RAS measured over the entire coded output symbol stream.

One thing to be careful in evaluating DSV and ASV according to the equations is that the coded line symbols $Y_n$ are assumed to take on levels of normalized spacing. That is, in the case of binary signaling, each $Y_n$ takes on $\{-½, ½\}$. Therefore, logical line symbol '1' and physical line symbol '½' will be used interchangeably in this description. The same will be true of '0' and '−½'. By use of ASV, the following theorem can be proved.

[Theorem 1]

If ASV is finite, the code has a spectral null at the Nyquist frequency.

The Nyquist frequency is f_N, by usual definition, half the signaling frequency R:

$$f\_N = R/2 = ½T \qquad [\text{Equation 3}]$$

And a spectral null of a code means two things:

There is no line spectrum (discrete power spectral component) at the associated frequency. There is a notch in the continuous power spectrum at the associated frequency. A code with a spectral null at the Nyquist frequency is usually called a Nyquist-free code. Thus the above theorem is equivalent to:

If ASV is finite, the code is a Nyquist-free code.

Nyquist-free codes possess an extra yet very important MB property:

[Theorem 2]

A Nyquist-free code is a minimum-bandwidth (MB) code.

An MB code is a code whose output symbol stream can be passed free of inter-symbol interference (ISI) through a bandwidth not greater than the Nyquist bandwidth. That is, with an MB code, the necessary channel bandwidth is only the Nyquist bandwidth.

In the case of non-MB line codes, a usual method of reducing the necessary channel bandwidth for ISI-free transmission is to pulse-shape the code symbols by a raised-cosine filter with a roll-off factor less than one. However, for random binary source data input, the horizontal eye width of such a system shrinks proportionally with the roll-off factor. With zero roll-off factor, i.e., with the Nyquist bandwidth, horizontal eye widths of such a code reduces to zero, closing the received eyes.

Code designers have used a code parameter called running digital sum (RDS) defined as $$RDS = \sum_{n=1}^{J} Y_n \qquad \text{[Equation 4]}$$

The peak-to-peak variation of RDS is called digital sum variation (DSV):

$$DSV = \max_{I,J,\{Y_n\}} \left| \sum_{n=I}^{J} Y_n \right| \qquad \text{[Equation 5]}$$

And the following theorem holds: [Theorem 3]

If DSV is finite, the code is a DC-free code.

Note the similarity between the ways derived the concept of DC-free and Nyquist-free properties. Yet, the Nyquist-free property accompanies a very important property, the MB property.

Also note that the smaller the value of DSV or ASV, the more profound the dc-free or MB property. The smaller the DSV, the wider the spectral notch at zero frequency. The smaller the ASV, the wider the spectral notch at the Nyquist frequency and the eye width in the eye pattern.

2. DETAILED DESCRIPTION OF THE DISCLOSED MB810 CODING METHOD

With the knowledge of ASV and DSV, and the object to design a dc-free MB code, one strategy is to seek for a short binary sequence for which RDS and RAS are both zero in a self-contained way. A code design based on a finite accumulation of this sequence will ensure finite DSV and ASV and thus a dc-free and MB code. A devised tool called a BUDA cell is used in the disclosed embodiment.

Consider a binary sequence '1100'. Its RDS is zero:

RDS of '1100'=(½)+(½)+(−½)+(−½)=0.

And its RAS is also zero:

RAS of '1100'=(−1)^n(½)+(−1)^(n+1)(½)+(−1)^(n+2)(−½)+(−1)^(n+3)(−½)=0.

It is also easy to see that the peak-to-peak variation of each, i.e., DSV and ASV, are both one.

Another way of illustrating the code parameters of the sequence is to draw the trace of the sequence over the RDS-RAS plane as done in FIG. 1. Assume that the RDS and RAS are zero at the start of the sequence. The '1100' sequence draws a diamond-shaped cell on the RDS-RAS plane. Recall that DSV is just the peak-to-peak variation of RDS by definition. Then from FIG. 1, the horizontal width of the cell corresponds to RDS, which is one. A similar observation is true of RAS, and the vertical width of the cell corresponds to RAS, which is also one. Thus the diamond-shaped cell represents a sequence of unit DSV and ASV, and thus is named BUDA for 'binary unit DSV and ASV.' Although the concept of BUDA is described by use of the '1100' sequence, it is to be noted that the same line of logic applies to any circular shift of the sequence. That is, all of '1100', '0110', '0011', and '1001' are equivalent in the sense of BUDA.

BUDA can be utilized as a basic building block for designing binary dc-free MB code. The procedural steps of a general design method for MBmn line code can be summarized as follows:

Step 1: Select the number of input bits m and the number of output bits n for an (m,n) block code. In this embodiment, n should be an even number; a binary MBmn code of an odd value of n is found to be impossible. Preferably m is n−1 for minimal redundancy. In this embodiment a code design with m equal to n−1 is impossible. In that case, m equal to n−2 will be taken.

Step 2: Accumulate a sufficient number of BUDA (binary unit DSV and ASV) cell, as shown in FIG. 1, to form a BUDA stack for derivation of the state diagram. Note that stacking cells horizontally would increase the DSV value. Doing so vertically would increase the ASV value. Therefore, where to add additionally needed cells will depend on the design preference for the two spectral properties.

Step 3: Pick one node as a state, and secure at least 2^m exit paths of an n-hop length. Denote each terminating node of each path as another state.

Step 4: Start with a new state and repeat the previous step. Paths on already existing state nodes should be terminated and generating new states should be avoided as far as possible.

Step 5: If it turns out that the stack needs to be expanded to complete the state diagram, add more cells to the stack either horizontally or vertically as appropriate.

Step 6: Reduce the number of states as possible with all transition paths terminating on one of the arranged states. If this trial succeeds, then the stack design is complete.

Step 7: At each state, arrange the mapping table as an input m-bit combination to an output n-bit combination. The result is the state transition table or codebook. Use the same mapping as far as possible across states to reduce the implementation complexity. This will also tend to simplify the decoding rule.

Step 8: If necessary, plot the power spectrum of the coded sequence with varying input bit probability, and choose the mapping that would generate the most desirable power spectral properties. Some of the criteria for desirable power spectral properties include the smoothness of the spectral envelope with the least spectral spikes and the symmetry of the spectral envelope across the whole frequency band of interest.

If all these steps are done successfully, then the code design itself is done with success.

Figure 5:
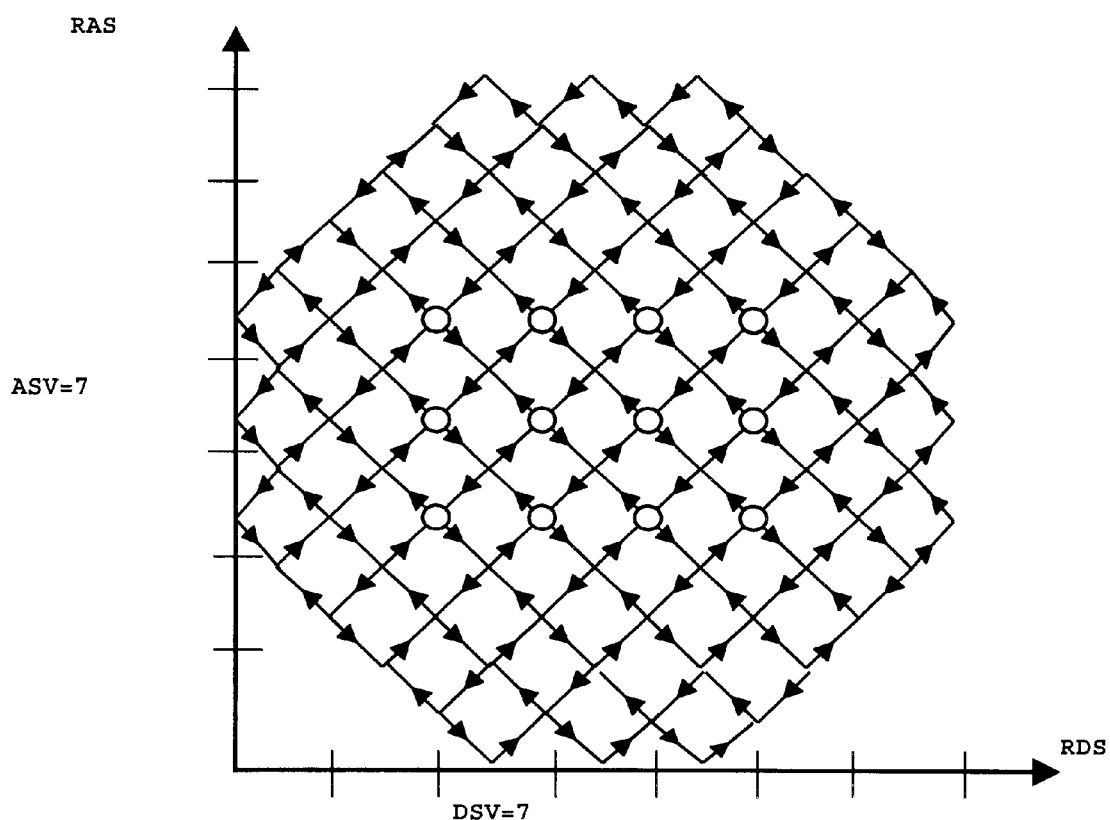
FIG. 5 shows a diagram for illustrating an MB810 design stack using BUDA cells.

An MB810 code was designed following the steps summarized in the above-described general coding method. The resultant BUDA stack diagram is shown in FIG. 5. The design resulted in 12 states. Both DSV and ASV are 7. There are at least 256(=2^8) exit paths out of each state. Each such path is 10 hop long and terminates on one of the other states.

Figure 6:
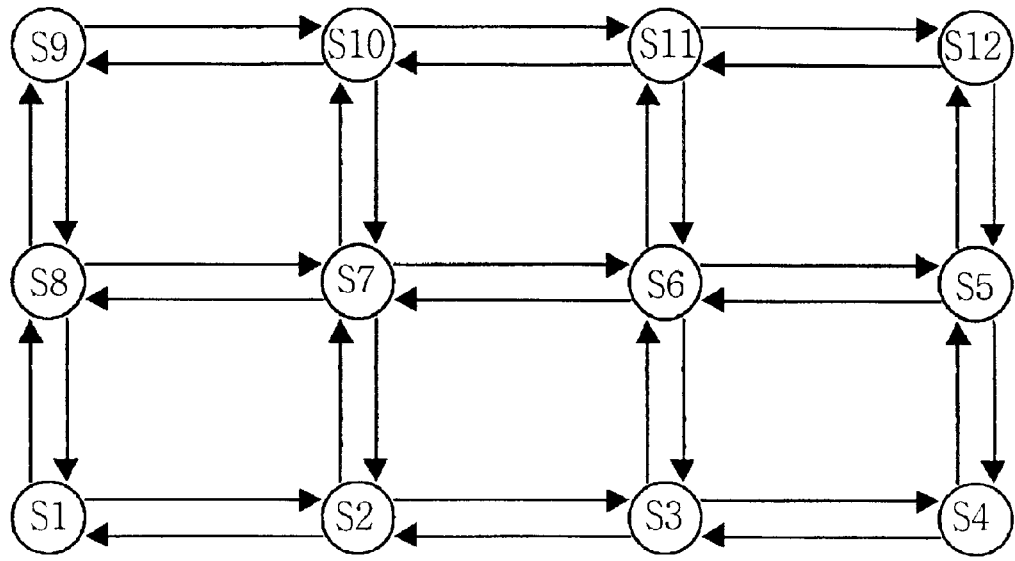
FIG. 6 shows a diagram for illustrating an MB810 state transition diagram.

The state diagram is too complex to draw, but a collapsed version is depicted in FIG. 6. It is noted that state transitions are mostly limited to adjacent neighboring states. This is but one design choice. By doing so, more mapping combinations may apply to more states, resulting in simpler decoder logic. It is also to be noted that not all transitions are among neighboring states. Although not shown in the simplified state diagram of FIG. 6, a few of the transition paths are among states across many state-hops away.

In the disclosed embodiment of the present invention, the binary unit DSV and ASV (BUDA) is devised to design codes of minimum bandwidth characteristics with the help of ASV and DSV. A BUDA cell is for a 4 bit codeword that has finite ASV and DSV. In the BUDA cell structure, vertical axis represents RAS and horizontal axis represents RDS and conveniently logical code set {0,1} is substituted by physical code set {-½, ½}. If a bit in a codeword is '1' then movement toward (+) direction occurs in BUDA cell structure. On the contrary, if a bit in a codeword is '0' then movement toward (-) direction occurs. If the final destination is the same state as the original state after processing all four bits, it means that the ASV of the codeword is 1 and the DSV of the codeword is also 1. It is likely that BUDA cells may be stacked up to meet the length of codewords to be designed. After all, designed codewords on the basis of BUDA cells satisfy DC-free, minimum bandwidth property.

Figure 2:
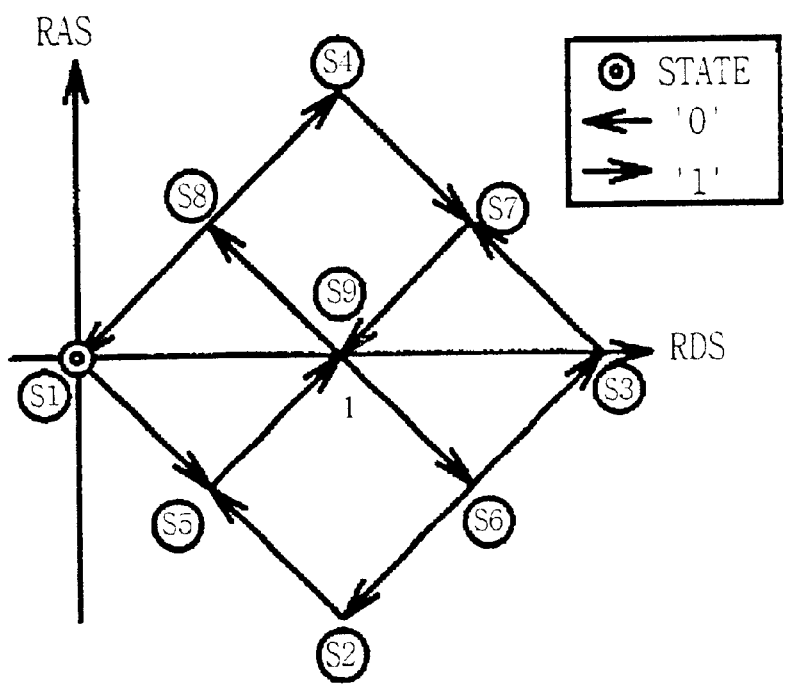
FIG. 2 shows a diagram for illustrating a combination of BUDA cells and positions of states.

FIG. 2 is a diagram illustrating a combination of BUDA cells and positions of states. In case a number of BUDA cells are used in order to design code of DC-free, minimum bandwidth, intersections of BUDA cells represent independent states. FIG. 2 shows 4 BUDA cells and 9 states.

Figure 3A:
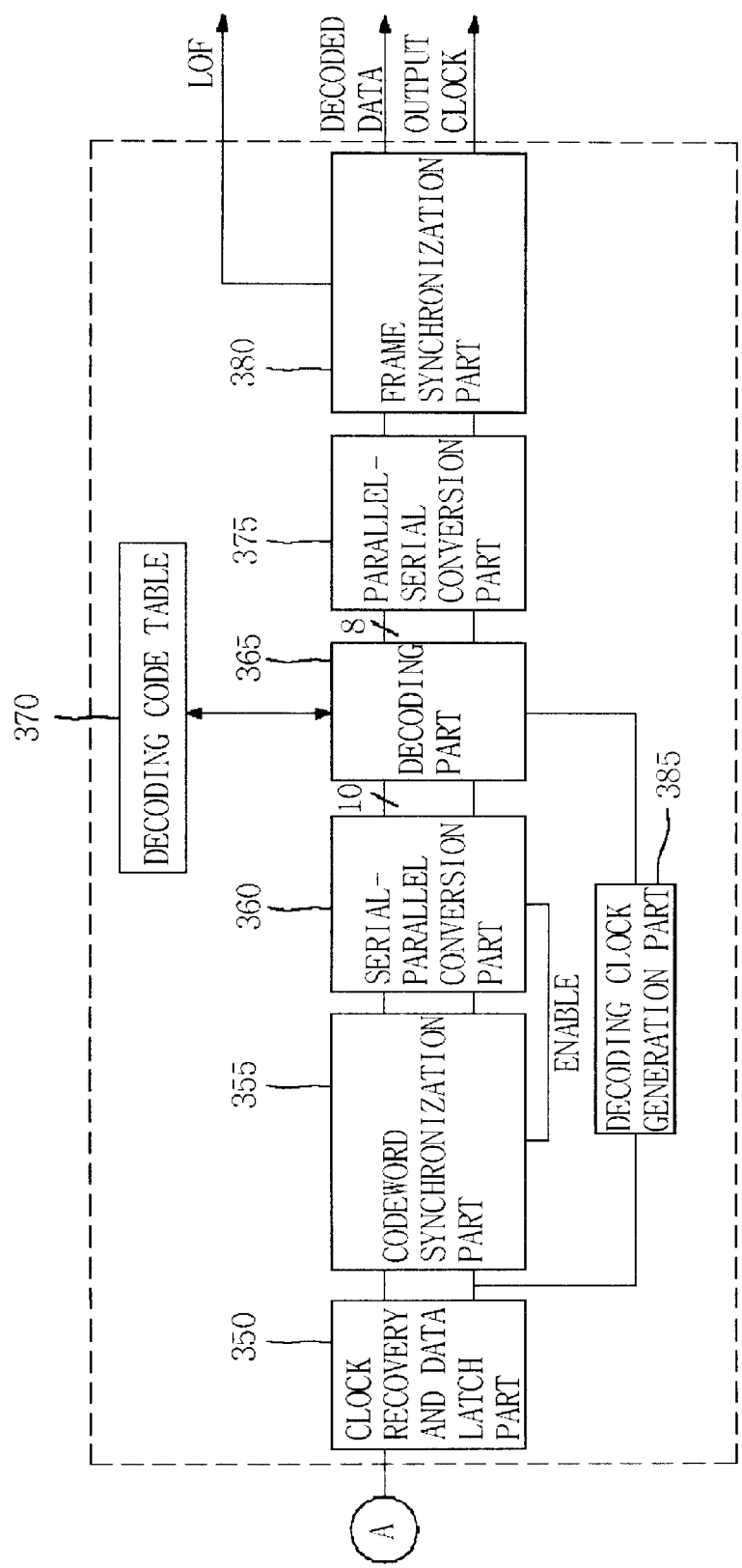
FIGS. 3A–3B shows a block diagram for illustrating an internal structure of a MB810 encoder and a MB810 decoder.
Figure 3B:
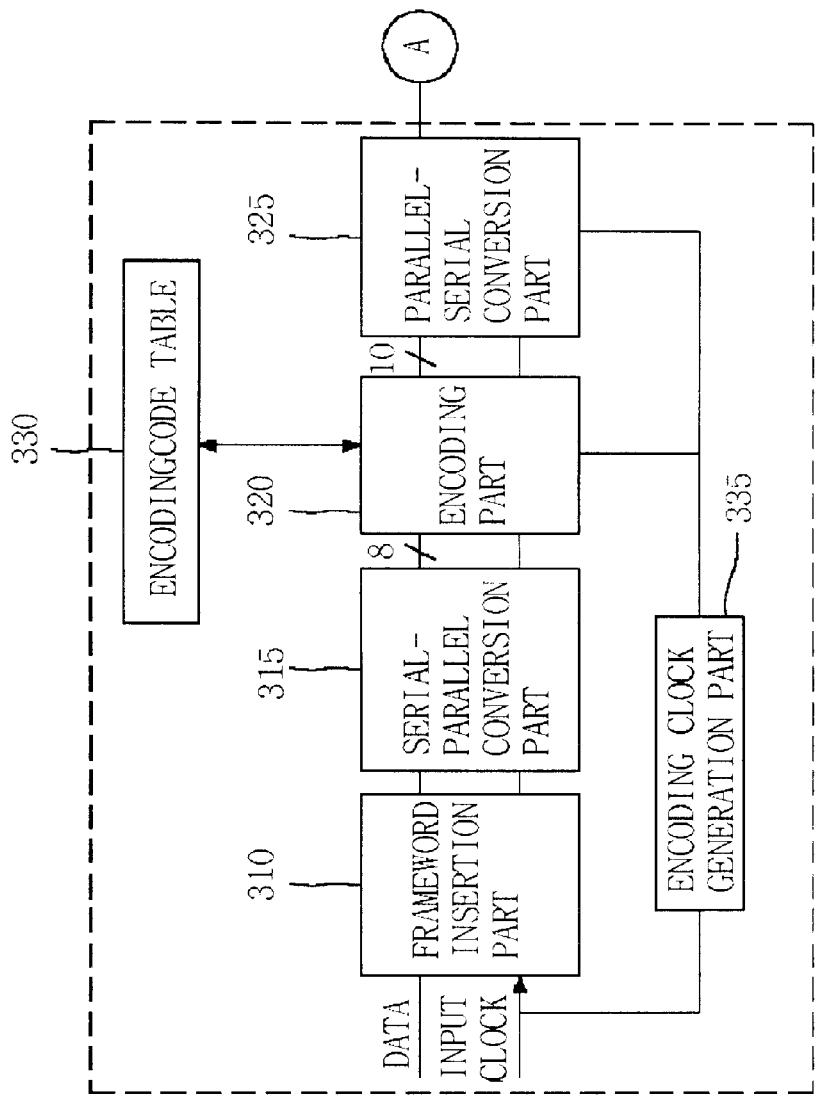

FIG. 3 is a block diagram illustrating the internal structure of an MB810 encoder and an MB810 decoder. As shown in FIG. 3, the MB810 encoder includes frame-word insertion part 310, serial-parallel conversion part 315, encoding part 320, parallel-serial conversion part 325, encoding code table 330, and encoding clock generation part 335. Data to be transmitted are supplied to the frame-word insertion part 310. The frame-word insertion part 310 makes up the transmission frame and inserts the frame-word frame that indicates where the frame starts. The serial-parallel conversion part 315 converts a serial data stream into an 8-bit parallel data stream. The encoding part 320 converts the 8-bit parallel data stream into a 10-bit codeword in the code table. The parallel-serial conversion part 325 receives the 10-bit parallel codeword and generates serial data stream. The encoding code table 330 stores 10-bit codewords that correspond to 256 8-bit data respectively. The encoding clock generation part 335 receives clock inputs and increases clock speed by 10/8 with the help of a phase-locked loop.

As shown in the FIG. 3, the MB810 decoder includes clock recovery and data latch part 350, codeword synchronization part 355, serial-parallel conversion part 360, decoding part 365, decoding code table 370, parallel-serial conversion part 375, frame synchronization part 380, and decoding clock generation part 385. The clock recovery and data latch part 350 performs clock recovery out of received data and fit latches data with recovered clock. The codeword synchronization part 355 detects a codeword that the frame-word has been converted into. The serial-parallel conversion part 360 receives an enable signal from the codeword synchronization part 355 and converts data indicated by the enable signal into 10-bit parallel data. The decoding part 365 converts the 10-bit parallel data into an 8-bit data stream with the help of the decoding code table 370. The decoding code table 370 stores a table mapping from 10-bit codeword data to 8-bit data. The parallel-serial conversion part 375 multiplexes 8-bit parallel data into a serial data stream by bit interleaving method. The frame synchronization part 380 identifies a frame-word inserted by the frame-word insertion part 310. The decoding clock generation part 385 receives clock inputs and decreases clock speed by 8/10 with the help of phase-locked loop.

Figure 4:
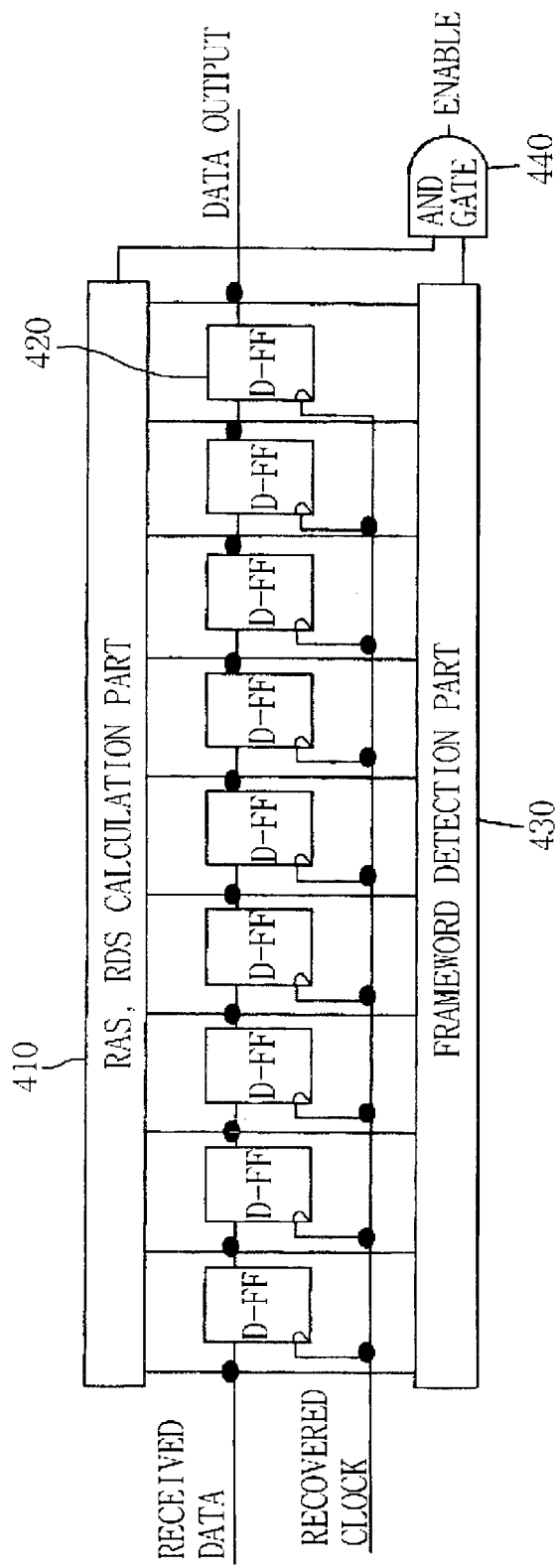
FIG. 4 shows a block diagram for illustrating an embodiment of a codeword synchronization block in accordance with the present invention.

FIG. 4 is a block diagram illustrating an embodiment of a code-word synchronization block in accordance with the present invention. The embodiment of the code-word synchronization block shown in the FIG. 4 comprises RAS, RDS calculation part 410, a number of D flip-flops 420, and frame-word detection part 430, and an AND gate 440.

The RAS, RDS calculation part 410 calculates RAS and RDS on the basis of equation 1 and equation 4 and monitors the outputs. If the calculated values are out of range, the output of the RAS, RDS calculation part 410 is "LOW". On the contrary, if the calculated values are appropriate, the output of the RAS, RDS calculation part 410 is "HIGH". The number of D flip-flops 420 shown in the FIG. 4 latch input data at a rising edge of the clock. The frame-word detection part 430 compares input data stream and the codeword of frame-word. If the codeword of the frame-word has been detected more than three times, the output of the frame-word detection part 430 becomes "HIGH". The output of the RAS, RDS calculation part 410 and the output of the frame-word detection part 430 are supplied to the AND gate 440.

FIG. 5 is a diagram illustrating a MB810 design stack using BUDA cells, and FIG. 6 shows a diagram for illustrating an MB810 state transition diagram. As shown in FIG. 5 and FIG. 6, (RDS, RAS) pairs are made. Out of 100 symbol sequences whose (RDS, RAS) are (1, 0) and 100 symbol sequences whose (RDS, RAS) are (-1, 0), 95 symbol sequences are selected to input data. Likewise, out of 100 symbol sequences whose (RDS, RAS) are (0, 1) and 100 symbol sequences whose (RDS, RAS) are (0, -1), 99 symbol sequences are selected to input data. Out of 50 symbol sequences whose (RDS, RAS) are (2, 1), (-2, -1), (-1, 2) and (1, -2), 40 symbol sequences are selected to input data. Out of 50 symbol sequences whose (RDS, RAS) are (-2, 1), (2, -1), (-1, -2) and (1, 2), 12 symbol sequences are selected to input data. This code is encoded state dependently, but is decoded state independently. Table 1 set forth below shows an encoding code table and table 2 shows a decoding code table for M 810.

Using the encoding code table, the MB810 encoder works as follows. First, the frame-word insertion part 310 receives input data and generates transmission frames. Second, the transmission frames are supplied to the serial-parallel conversion part 315 with clock information. Third, the serial-parallel conversion part 315 converts serial data stream into 8-bit parallel data stream and supplies the 8-bit parallel data stream to the encoding part 320. The encoding part 320 converts the 8-bit parallel data stream into the 10-bit codeword using the encoding code table. The parallel-serial conversion part 325 receives clock information from the encoding clock generation part 335 and the 10-bit parallel codeword. In addition, the parallel-serial conversion part 325 generates serial data stream using simple bit interleaving method. The encoding clock generation part 335 receives clock inputs and increases clock speed by 10/8 with the help of the phase-locked loop.

Using the decoding code table, the MB810 decoder works as follows. The clock recovery and data latch part 350 performs clock recovery out of received data and latches data with the recovered clock. The codeword synchronization part 355 detects a codeword that the frame-word has been converted into. The serial-parallel conversion part 360 receives an enable signal from the codeword synchronization part 355 and converts data indicated by the enable signal into 10-bit parallel data. The decoding part 365 converts the 10-bit parallel data into the 8-bit data stream with the help of the decoding code table 370. The decoding code table 370 stores a table mapping from the 10-bit codeword data to the 8-bit data. The parallel-serial conversion part 375 multiplexes the 8-bit parallel data into a serial data stream by a bit interleaving method. The frame synchronization part 380 identifies a frame-word inserted by the frame-word insertion part 310. The decoding clock generation part 385 receives clock inputs and decreases clock speed by 8/10 with the help of the phase-locked loop.

Figure 7:
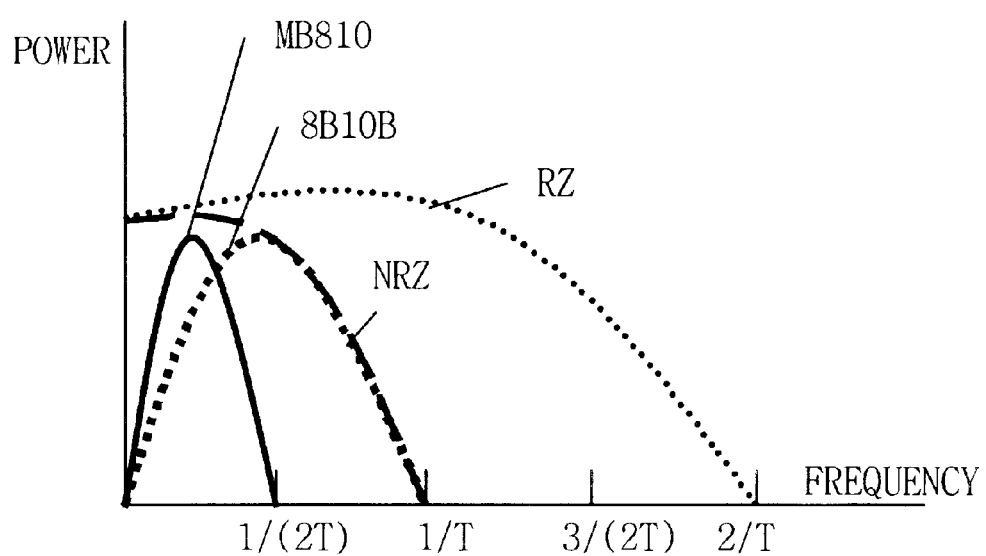
FIG. 7 shows a graph for illustrating spectrums of codewords.

FIG. 7 is a graph illustrating spectrums of conventional codes and the MB810 code. The MB810 code satisfies the DC-free property and its required bandwidth is only the half of the IBM 8B/10B bandwidth. The output rates are assumed to be the same for spectrum comparison.

Table 1 is the mapping table for the MB810 encoding table and table 2 is a mapping table for the M1810 decoding table.

The disclosed embodiment provides a method and apparatus for encoding MB810 line code with the characteristics of minimum bandwidth and DC-free, which prevents signal distortion and component operated in saturation region due to DC-free property. In addition, the method and apparatus of the disclosed embodiment provides a transmission bandwidth that is half of the required bandwidth so that transmission efficiency of the network increases by about 40% compared to the NRZ data. The quality of transmission signals is improved due to noise bandwidth reduction, and the overall price of the transmission system is lower with the help of an increase in receiver sensitivity of signal detection devices. Generally speaking, since the quality of signals and receiver sensitivity is directly related to the overall cost of the network in optical communication systems, the disclosed embodiment provides ways to extend transmission distance of optical path in the network with limited amount of budget. The application area includes optical communication networks, wide-bandwith wireless LAN and high-capacity data transmission networks like 10 Gbit Ethernet LAN and data storage devices.

Although a preferred embodiment of the present invention has been disclosed for illustrative purposes, those skilled in the art will appreciate that various modifications, additions and substitutions are possible, without departing from the scope and spirit of the invention as recited in the accompanying claims.

TABLE 1

Table 1 and 2. MB810 Encoding code-book and Decoding code-book
MB810 Encoding code-book

| NO | INPUT | S1, 2, 3, 7, 8, 9 | S4, 5, 6, 10, 11, 12 |
|---|---|---|---|
| 0 | 00000000 | 0011101101(1 0) | 0001001110(−1 0) |
| 1 | 00000001 | 0001101111(1 0) | 0001001011(−1 0) |
| 2 | 00000010 | 0001111011(1 0) | 0001011010(−1 0) |
| 3 | 00000011 | 0001111110(1 0) | 0000100111(−1 0) |
| 4 | 00000100 | 0010011111(1 0) | 0000101101(−1 0) |
| 5 | 00000101 | 0010110111(1 0) | 0000110011(−1 0) |
| 6 | 00000110 | 0010111101(1 0) | 0000110110(−1 0) |
| 7 | 00000111 | 0011001111(1 0) | 0000111001(−1 0) |
| 8 | 00001000 | 0011011011(1 0) | 0000111100(−1 0) |
| 9 | 00001001 | 0011110011(1 0) | 0001100011(−1 0) |
| 10 | 00001010 | 0011110110(1 0) | 0001100110(−1 0) |
| 11 | 00001011 | 0011111001(1 0) | 0001101001(−1 0) |
| 12 | 00001100 | 0011111100(1 0) | 0001101100(−1 0) |
| 13 | 00001101 | 0100101111(1 0) | 0001110010(−1 0) |
| 14 | 00001110 | 0100111011(1 0) | 0001111000(−1 0) |
| 15 | 00001111 | 0100111110(1 0) | 0010000111(−1 0) |
| 16 | 00010000 | 0101101011(1 0) | 0010001101(−1 0) |
| 17 | 00010001 | 0101101110(1 0) | 0010010011(−1 0) |
| 18 | 00010010 | 0101111010(1 0) | 0010010110(−1 0) |
| 19 | 00010011 | 0110001111(1 0) | 0010011001(−1 0) |
| 20 | 00010100 | 0110011011(1 0) | 0010011100(−1 0) |
| 21 | 00010101 | 0110011110(1 0) | 0010100101(−1 0) |
| 22 | 00010110 | 0110100111(1 0) | 0010110001(−1 0) |
| 23 | 00010111 | 0110101101(1 0) | 0010110100(−1 0) |
| 24 | 00011000 | 0110110011(1 0) | 0011000011(−1 0) |
| 25 | 00011001 | 0110110110(1 0) | 0011000110(−1 0) |
| 26 | 00011010 | 0110111001(1 0) | 0011001001(−1 0) |
| 27 | 00011011 | 0110111100(1 0) | 0011001100(−1 0) |
| 28 | 00011100 | 0111001011(1 0) | 0011010010(−1 0) |
| 29 | 00011101 | 0111001110(1 0) | 0011011000(−1 0) |
| 30 | 00011110 | 0111011010(1 0) | 0011100001(−1 0) |
| 31 | 00011111 | 0111100011(1 0) | 0011100100(−1 0) |
| 32 | 00100000 | 0111100110(1 0) | 0011110000(−1 0) |
| 33 | 00100001 | 0111101001(1 0) | 0100001011(−1 0) |
| 34 | 00100010 | 0111101100(1 0) | 0100001110(−1 0) |
| 35 | 00100011 | 0111110010(1 0) | 0100011010(−1 0) |
| 36 | 00100100 | 0111111000(1 0) | 0100100011(−1 0) |
| 37 | 00100101 | 0011011110(1 0) | 0100100110(−1 0) |
| 38 | 00100110 | 1000110111(1 0) | 0100101001(−1 0) |
| 39 | 00100111 | 1000111101(1 0) | 0100101100(−1 0) |
| 40 | 00101000 | 1001001111(1 0) | 0100110010(−1 0) |
| 41 | 00101001 | 1001011011(1 0) | 0100111000(−1 0) |
| 42 | 00101010 | 1001011110(1 0) | 0101001010(−1 0) |
| 43 | 00101011 | 1001100111(1 0) | 0101100010(−1 0) |

TABLE 1-continued

Table 1 and 2. MB810 Encoding code-book and Decoding code-book
MB810 Encoding code-book

| | | | |
|---|---|---|---|
| 44 | 00101100 | 1001101101(1 0) | 0101101000(−1 0) |
| 45 | 00101101 | 1001110011(1 0) | 0110000011(−1 0) |
| 46 | 00101110 | 1001110110(1 0) | 0110000110(−1 0) |
| 47 | 00101111 | 1001111001(1 0) | 0110001001(−1 0) |
| 48 | 00110000 | 1001111100(1 0) | 0110001100(−1 0) |
| 49 | 00110001 | 1010010111(1 0) | 0110010010(−1 0) |
| 50 | 00110010 | 1010011101(1 0) | 0110011000(−1 0) |
| 51 | 00110011 | 1010110101(1 0) | 0110100001(−1 0) |
| 52 | 00110100 | 1011000111(1 0) | 0110100100(−1 0) |
| 53 | 00110101 | 1011001101(1 0) | 0110110000(−1 0) |
| 54 | 00110110 | 1011010011(1 0) | 0111000010(−1 0) |
| 55 | 00110111 | 1011010110(1 0) | 0111001000(−1 0) |
| 56 | 00111000 | 1011011001(1 0) | 0111100000(−1 0) |
| 57 | 00111001 | 1011011100(1 0) | 1000000111(−1 0) |
| 58 | 00111010 | 1011100101(1 0) | 1000001101(−1 0) |
| 59 | 00111011 | 1011110001(1 0) | 1000010011(−1 0) |
| 60 | 00111100 | 1011110100(1 0) | 1000010110(−1 0) |
| 61 | 00111101 | 1100001111(1 0) | 1000011001(−1 0) |
| 62 | 00111110 | 1100011011(1 0) | 1000011100(−1 0) |
| 63 | 00111111 | 1100011110(1 0) | 1000100101(−1 0) |
| 64 | 01000000 | 1100100111(1 0) | 1000110001(−1 0) |
| 65 | 01000001 | 1100101101(1 0) | 1000110100(−1 0) |
| 66 | 01000010 | 1100110011(1 0) | 1001000011(−1 0) |
| 67 | 01000011 | 1100110110(1 0) | 1001000110(−1 0) |
| 68 | 01000100 | 1100111001(1 0) | 1001001001(−1 0) |
| 69 | 01000101 | 1100111100(1 0) | 1001001100(−1 0) |
| 70 | 01000110 | 1101001011(1 0) | 1001010010(−1 0) |
| 71 | 01000111 | 1101001110(1 0) | 1001011000(−1 0) |
| 72 | 01001000 | 1101011010(1 0) | 1001100001(−1 0) |
| 73 | 01001001 | 1101100011(1 0) | 1001100100(−1 0) |
| 74 | 01001010 | 1101100110(1 0) | 1001110000(−1 0) |
| 75 | 01001011 | 1101101001(1 0) | 1010000101(−1 0) |
| 76 | 01001100 | 1101101100(1 0) | 1010010001(−1 0) |
| 77 | 01001101 | 1101110010(1 0) | 1010010100(−1 0) |
| 78 | 01001110 | 1101111000(1 0) | 1011000001(−1 0) |
| 79 | 01001111 | 1110000111(1 0) | 1011000100(−1 0) |
| 80 | 01010000 | 1110001101(1 0) | 1011010000(−1 0) |
| 81 | 01010001 | 1110010011(1 0) | 1100000011(−1 0) |
| 82 | 01010010 | 1110010110(1 0) | 1100000110(−1 0) |
| 83 | 01010011 | 1110011091(1 0) | 1100001001(−1 0) |
| 84 | 01010100 | 1110011100(1 0) | 1100001100(−1 0) |
| 85 | 01010101 | 1110100101(1 0) | 1100010010(−1 0) |
| 86 | 01010110 | 1110110001(1 0) | 1100011000(−1 0) |
| 87 | 01010111 | 1110110100(1 0) | 1100100001(−1 0) |
| 88 | 01011000 | 1111000011(1 0) | 1100100100(−1 0) |
| 89 | 01011001 | 1111000110(1 0) | 1100110000(−1 0) |
| 90 | 01011010 | 1111001001(1 0) | 1101000010(−1 0) |
| 91 | 01011011 | 1111001100(1 0) | 1101001000(−1 0) |
| 92 | 01011100 | 1111010010(1 0) | 1110010000(−1 0) |
| 93 | 01011101 | 1111011000(1 0) | 1110000001(−1 0) |
| 94 | 01011110 | 1100011000(1 0) | 1110000100(−1 0) |

| NO | INPUT | S7, 8, 9, 10, 11, 12 | S1, 2, 3, 4, 5, 6 |
|---|---|---|---|
| 95 | 01011111 | 1110100001(0 −1) | 1101100001(0 1) |
| 96 | 01100000 | 1110100100(0 −1) | 1101100100(0 1) |
| 97 | 01100001 | 1110110000(0 −1) | 1101110000(0 1) |
| 98 | 01100010 | 1111000010(0 −1) | 1110000101(0 1) |
| 99 | 01100011 | 1111001000(0 −1) | 1110010001(0 1) |
| 100 | 01100100 | 0000101111(0 −1) | 1110010100(0 1) |
| 101 | 01100101 | 0000111011(0 −1) | 0000110111(0 1) |
| 102 | 01100110 | 0000111110(0 −1) | 0000111111(0 1) |
| 103 | 01100111 | 0001101011(0 −1) | 0001001111(0 1) |
| 104 | 01101000 | 0001101110(0 −1) | 0001011011(0 1) |
| 105 | 01101001 | 0001111010(0 −1) | 0001011110(0 1) |
| 106 | 01101010 | 0010001111(0 −1) | 0001100111(0 1) |
| 107 | 01101011 | 0010011011(0 −1) | 0001101101(0 1) |
| 108 | 01101100 | 0010011110(0 −1) | 0001110011(0 1) |
| 109 | 01101110 | 0010101101(0 −1) | 1111000001(0 1) |
| 110 | 01101101 | 0010100111(0 −1) | 1111000100(0 1) |
| 111 | 01101111 | 0010110011(0 −1) | 1111010000(0 1) |
| 112 | 01110000 | 0010110110(0 −1) | 0001110110(0 1) |
| 113 | 01110001 | 0010111001(0 −1) | 0001111001(0 1) |
| 114 | 01110010 | 0010111100(0 −1) | 0001111100(0 1) |
| 115 | 01110011 | 0011001011(0 −1) | 0010010111(0 1) |
| 116 | 01110100 | 0011001110(0 −1) | 0010011101(0 1) |

TABLE 1-continued

Table 1 and 2. MB810 Encoding code-book and Decoding code-book
MB810 Encoding code-book

| | | | |
|---|---|---|---|
| 117 | 01110101 | 0011011010(0 −1) | 0010110101(0 1) |
| 118 | 01110110 | 0011100011(0 −1) | 0011000111(0 1) |
| 119 | 01110111 | 0011100110(0 −1) | 0011001101(0 1) |
| 120 | 01111000 | 0011101001(0 −1) | 0011010011(0 1) |
| 121 | 01111001 | 0011101100(0 −1) | 0011010110(0 1) |
| 122 | 01111010 | 0011110010(0 −1) | 0011011001(0 1) |
| 123 | 01111011 | 0011111000(0 −1) | 0011011100(0 1) |
| 124 | 01111100 | 0100101011(0 −1) | 0011100101(0 1) |
| 125 | 01111101 | 0100101110(0 −1) | 0011110001(0 1) |
| 126 | 01111110 | 0100111010(0 −1) | 0011110100(0 1) |
| 127 | 01111111 | 0101101010(0 −1) | 0100001111(0 1) |
| 128 | 10000000 | 0110001011(0 −1) | 0100011011(0 1) |
| 129 | 10000001 | 0110001110(0 −1) | 0100011110(0 1) |
| 130 | 10000010 | 0110011010(0 −1) | 0100100111(0 1) |
| 131 | 10000011 | 0110100011(0 −1) | 0100101101(0 1) |
| 132 | 10000100 | 0110100110(0 −1) | 0100110011(0 1) |
| 133 | 10000101 | 0110101001(0 −1) | 0100110110(0 1) |
| 134 | 10000110 | 0110101100(0 −1) | 0100111001(0 1) |
| 135 | 10900111 | 0110110010(0 −1) | 0100111100(0 1) |
| 136 | 10001000 | 0110111000(0 −1) | 0101001011(0 1) |
| 137 | 10001001 | 0111001010(0 −1) | 0101001110(0 1) |
| 138 | 10001010 | 0111100010(0 −1) | 0101011010(0 1) |
| 139 | 10001011 | 0111101000(0 −1) | 0101100011(0 1) |
| 140 | 10001100 | 1000001111(0 −1) | 0101100110(0 1) |
| 141 | 10001101 | 1000011011(0 −1) | 0101101001(0 1) |
| 142 | 10001110 | 1000011110(0 −1) | 0101101100(0 1) |
| 143 | 10001111 | 1000100111(0 −1) | 0101110010(0 1) |
| 144 | 10010000 | 1000101101(0 −1) | 0101111000(0 1) |
| 145 | 10010001 | 1000110011(0 −1) | 0110000111(0 1) |
| 146 | 10010010 | 1000110110(0 −1) | 0110001101(0 1) |
| 147 | 10010011 | 1000111001(0 −1) | 0110010011(0 1) |
| 148 | 10010100 | 1000111100(0 −1) | 0110010110(0 1) |
| 149 | 10010101 | 1001001011(0 −1) | 0110011011(0 1) |
| 150 | 10010110 | 1001001110(0 −1) | 0110011100(0 1) |
| 151 | 10010111 | 1001011010(0 −1) | 0110100101(0 1) |
| 152 | 10011000 | 1001100011(0 −1) | 0110110001(0 1) |
| 153 | 1001101 | 1001100110(0 −1) | 0110110100(0 1) |
| 154 | 10011010 | 1001101001(0 −1) | 0111000011(0 1) |
| 155 | 10011011 | 1001101100(0 −1) | 0111000110(0 1) |
| 156 | 10011100 | 1001110010(0 −1) | 0111001001(0 1) |
| 157 | 10011101 | 1001111000(0 −1) | 0111001100(0 1) |
| 158 | 10011110 | 1010000111(0 −1) | 0111010010(0 1) |
| 159 | 10011111 | 1010001101(0 −1) | 0111011000(0 1) |
| 160 | 10100000 | 1010010911(0 −1) | 0111100001(0 1) |
| 161 | 10100001 | 1010010110(0 −1) | 0111100100(0 1) |
| 162 | 10100010 | 1010011001(0 −1) | 0111110000(0 1) |
| 163 | 10100011 | 1010011100(0 −1) | 1000010111(0 1) |
| 164 | 10100100 | 1010109101(0 −1) | 1000011101(0 1) |
| 165 | 10100101 | 1010110001(0 −1) | 1000110101(0 1) |
| 166 | 10100110 | 1010110100(0 −1) | 1001000110(0 1) |
| 167 | 10100111 | 1011000011(0 −1) | 1001001101(0 1) |
| 168 | 10101000 | 1011000110(0 −1) | 1001010011(0 1) |
| 169 | 10101001 | 1011001001(0 −1) | 1001010110(0 1) |
| 170 | 10101010 | 1011001100(0 −1) | 1001011010(0 1) |
| 171 | 10101011 | 1011010010(0 −1) | 1001011100(0 1) |
| 172 | 10101100 | 1011011000(0 −1) | 1001100101(0 1) |
| 173 | 10101101 | 1011100001(0 −1) | 1001110001(0 1) |
| 174 | 10101110 | 1011100100(0 −1) | 1001110110(0 1) |
| 175 | 10101111 | 1011110000(0 −1) | 1010010101(0 1) |
| 176 | 10110000 | 1100001011(0 −1) | 1011000101(0 1) |
| 177 | 10110001 | 1100001110(0 −1) | 1011010001(0 1) |
| 178 | 10110010 | 1100011010(0 −1) | 1011010100(0 1) |
| 179 | 10110011 | 1100100011(0 −1) | 1100000111(0 1) |
| 180 | 10110100 | 1100100110(0 −1) | 1100001101(0 1) |
| 181 | 10110101 | 1100101001(0 −1) | 1100010011(0 1) |
| 182 | 10110110 | 1100101100(0 −1) | 1100010110(0 1) |
| 183 | 10110111 | 1100110010(0 −1) | 1100011001(0 1) |
| 184 | 10111000 | 1100111000(0 −1) | 1100011100(0 1) |
| 185 | 10111001 | 1101001010(0 −1) | 1100100101(0 1) |
| 186 | 10111010 | 1101100010(0 −1) | 1100110001(0 1) |
| 187 | 10111011 | 1101101000(0 −1) | 1100110100(0 1) |
| 188 | 10111100 | 1110000011(0 −1) | 1101000011(0 1) |
| 189 | 10111101 | 1110000110(0 −1) | 1101000110(0 1) |
| 190 | 10111110 | 1110001001(0 −1) | 1101001001(0 1) |
| 191 | 10111111 | 1110001100(0 −1) | 1101001100(0 1) |

TABLE 1-continued

Table 1 and 2. MB810 Encoding code-book and Decoding code-book
MB810 Encoding code-book

| 192 | 11000000 | 1110010010(0 −1) | 1101010010(0 1) |
| 193 | 11000001 | 1110011000(0 −1) | 1101011000(0 1) |

| NO | INPUT | S7, 8, 9, 10 | S3, 4, 5, 6 | S11, 12 | S1, 2 |
|---|---|---|---|---|---|
| 194 | 11000010 | 0011101111(2 −1) | 1001000001(−2 1) | 0010100110(−1 −2) | 0100111101(1 2) |
| 195 | 11000011 | 0011111011(2 −1) | 1001000100(−2 1) | 0010101001(−1 −2) | 0001110111(1 2) |
| 196 | 11000100 | 1111011010(2 −1) | 1001010000(−2 1) | 0010101100(−1 −2) | 0101011011(1 2) |
| 197 | 11000101 | 0110101111(2 −1) | 0000100101(−2 1) | 0010110010(−1 −2) | 0101011110(1 2) |
| 198 | 11000110 | 0110111011(2 −1) | 0000110001(−2 1) | 0010111000(−1 −2) | 0101100111(1 2) |
| 199 | 11000111 | 0110111110(2 −1) | 0000110100(−2 1) | 0011001010(−1 −2) | 0101101101(1 2) |
| 200 | 11001000 | 0111101011(2 −1) | 0001000011(−2 1) | 0b11100010(−1 −2) | 0101110011(1 2) |
| 201 | 11001001 | 0111101110(2 −1) | 0001000110(−2 1) | 0010100011(−1 −2) | 0100110111(1 2) |
| 202 | 11001010 | 0111111010(2 −1) | 0001001001(−2 1) | 0010011010(−1 −2) | 0001111101(1 2) |
| 203 | 11001011 | 1001101111(2 −1) | 0001001100(−2 1) | 0011101000(−1 −2) | 0101110110(1 2) |
| 204 | 11001100 | 1001111011(2 −1) | 0001010010(−2 1) | 0100101010(−1 −2) | 0101111001(1 2) |
| 205 | 11001101 | 1001111110(2 −1) | 0001100001(−2 1) | 1100101000(−1 −2) | 1101100101(1 2) |
| 206 | 11001110 | 1010110111(2 −1) | 0001100100(−2 1) | 1100001010(−1 −2) | 1101110001(1 2) |
| 207 | 11001111 | 1010111101(2 −1) | 0001011000(−2 1) | 1100100910(−1 −2) | 1101110100(1 2) |
| 208 | 11010000 | 1101111010(2 −1) | 0100100100(−2 1) | 1001101000(−1 −2) | 1001011101(1 2) |
| 209 | 11010001 | 1110001111(2 −1) | 0100110000(−2 1) | 1110000101(−1 −2) | 1001110101(1 2) |
| 210 | 11010010 | 1110011011(2 −1) | 0101000010(−2 1) | 1010000110(−1 −2) | 1011010101(1 2) |
| 211 | 11010011 | 1110011110(2 −1) | 0101001000(−2 1) | 1010001001(−1 −2) | 1100010111(1 2) |
| 212 | 11010100 | 1110100111(2 −1) | 0101100000(−2 1) | 1010001100(−1 −2) | 1100011101(1 2) |
| 213 | 11010101 | 1110101101(2 −1) | 0110000001(−2 1) | 1010010010(−1 −2) | 1100110101(1 2) |
| 214 | 11010110 | 1110110011(2 −1) | 0110000100(−2 1) | 1010011000(−1 −2) | 1101000111(1 2) |
| 215 | 11010111 | 1110110110(2 −1) | 0110010000(−2 1) | 1010100001(−1 −2) | 1101001101(1 2) |
| 216 | 11011000 | 1110111001(2 −1) | 1100010000(−2 1) | 1010100100(−1 −2) | 1101010011(1 2) |
| 217 | 11011001 | 1011001111(2 −1) | 1100000100(−2 1) | 0110001010(−1 −2) | 0011010111(1 2) |
| 218 | 11011010 | 1011011011(2 −1) | 0010000101(−2 1) | 0110100010(−1 −2) | 0110010111(1 2) |
| 219 | 11011011 | 1011011110(2 −1) | 0010000001(−2 1) | 0110101000(−1 −2) | 0110011101(1 2) |
| 220 | 11011100 | 1011100111(2 −1) | 0010010100(−2 1) | 1011100010(−1 −2) | 0101010101(1 2) |
| 221 | 11011101 | 1011101101(2 −1) | 0011000001(−2 1) | 1011001000(−1 −2) | 0111000111(1 2) |
| 222 | 11011110 | 1011110011(2 −1) | 0011000100(−2 1) | 1000011010(−1 −2) | 0111001101(1 2) |
| 223 | 11011111 | 1011110110(2 −1) | 0011010000(−2 1) | 1000100011(−1 −2) | 0111010011(1 2) |
| 224 | 11100000 | 1011111001(2 −1) | 0100000011(−2 1) | 1000100110(−1 −2) | 0111010110(1 2) |
| 225 | 11100001 | 1011111100(2 −1) | 0100000110(−2 1) | 1000101001(−1 −2) | 0111011001(1 2) |
| 226 | 11100010 | 1100101111(2 −1) | 0100001001(−2 1) | 1000101100(−1 −2) | 0111011100(1 2) |
| 227 | 11100011 | 1100111011(2 −1) | 0100001100(−2 1) | 1000110010(−1 −2) | 0111100101(1 2) |
| 228 | 11100100 | 1100111110(2 −1) | 0100010010(−2 1) | 1000111000(−1 −2) | 0011011101(1 2) |
| 229 | 11100101 | 1101101011(2 −1) | 0100011000(−2 1) | 1001001010(−1 −2) | 0111110100(1 2) |
| 230 | 11100110 | 1101101110(2 −1) | 0100100010(−2 1) | 1001100010(−1 −2) | 1001010111(1 2) |
| 231 | 11100111 | 1110111100(2 −1) | 1000000101(−2 1) | 0001101010(−1 −2) | 1110010101(1 2) |
| 232 | 11101000 | 1111001011(2 −1) | 1000010001(−2 1) | 0010001011(−1 −2) | 0011110101(1 2) |
| 233 | 11101001 | 1111001110(2 −1) | 1000010100(−2 1) | 0010001110(−1 −2) | 1101011100(1 2) |

| NO | INPUT | S9, 10 | S3, 4 | S5, 6, 11, 12 | S1, 2, 7, 8 |
|---|---|---|---|---|---|
| 234 | 11101010 | 0110101011(1 −2) | 0001010110(−1 2) | 0010100001(−2 −1) | 0101111011(2 1) |
| 235 | 11101011 | 0110101110(1 −2) | 0001011001(−1 2) | 0010010010(−2 −1) | 0111110011(2 1) |
| 236 | 11101100 | 0110111010(1 −2) | 0001011100(−1 2) | 0010011000(−2 −1) | 0111110111(2 1) |
| 237 | 11101101 | 0111101010(1 −2) | 0001100101(−1 2) | 0001010010(−2 −1) | 0110110111(2 1) |
| 238 | 11101110 | 1011110010(1 −2) | 0001110001(−1 2) | 0001100010(−2 −1) | 0110111101(2 1) |
| 230 | 11101111 | 1000111011(1 −2) | 0001110100(−1 2) | 0001101000(−2 −1) | 1101101101(2 1) |
| 240 | 11110000 | 1000111110(1 −2) | 0010010101(−1 2) | 0010100100(−2 −1) | 0111011011(2 1) |
| 241 | 11110001 | 1001101011(1 −2) | 0011000101(−1 2) | 0010000110(−2 −1) | 0111011110(2 1) |
| 242 | 11110010 | 1001101110(1 −2) | 0011010001(−1 2) | 0010001001(−2 −1) | 0111100111(2 1) |
| 243 | 11110011 | 1001111010(1 −2) | 0011010100(−1 2) | 0010001100(−2 −1) | 0111101101(2 1) |
| 244 | 11110100 | 1010011011(1 −2) | 0100001101(−1 2) | 0011000010(−2 −1) | 1001110111(2 1) |
| 245 | 11110101 | 1010011110(1 −2) | 0100010011(−1 2) | 0011001000(−2 −1) | 1001111101(2 1) |
| 246 | 11110110 | 1010100111(1 −2) | 0100010110(−1 2) | 1001000010(−2 −1) | 1100011101(2 1) |
| 247 | 11110111 | 1010101101(1 −2) | 0100011001(−1 2) | 1001001000(−2 −1) | 1101110101(2 1) |
| 248 | 11111000 | 1010110011(1 −2) | 0100011100(−1 2) | 1000001000(−2 −1) | 1101111001(2 1) |
| 240 | 11111001 | 1010110110(1 −2) | 0100100101(−1 2) | 1000100100(−2 −1) | 1101111100(2 1) |
| 250 | 11111010 | 1010111001(1 −2) | 0100110001(−1 2) | 0100001010(−2 −1) | 1011011101(2 1) |
| 251 | 11111011 | 1010111100(1 −2) | 0100110100(−1 2) | 0100100010(−2 −1) | 1011110101(2 1) |
| 252 | 11111100 | 1100101011(1 −2) | 0110000101(−1 2) | 1000010010(−2 −1) | 1101110011(2 1) |
| 253 | 11111101 | 0011101011(1 −2) | 0001000111(−1 2) | 0110000010(−2 −1) | 1100110111(2 1) |
| 254 | 11111110 | 0011101110(1 −2) | 0001001101(−1 2) | 0110001000(−2 −1) | 1100111101(2 1) |
| 255 | 11111111 | 0010111011(1 −2) | 0001010011(−1 2) | 0100101000(−2 −1) | 1101110110(2 1) |

TABLE 2

| NO | Output | Received symbol | |
|---|---|---|---|
| 0 | 00000000 | 0011101101 | 0001001110 |
| 1 | 00000001 | 0001101111 | 0001001011 |
| 2 | 00000010 | 0001111011 | 0001011010 |
| 3 | 00000011 | 0001111110 | 0000100111 |
| 4 | 00000100 | 0010011111 | 0000101101 |
| 5 | 00000101 | 0010110111 | 0000110011 |
| 6 | 00000110 | 0010111101 | 0000110110 |
| 7 | 00000111 | 0011001111 | 0000111001 |
| 8 | 00001000 | 0011011011 | 0000111100 |
| 9 | 00001001 | 0011110011 | 0001100011 |
| 10 | 00001010 | 0011110110 | 0001100110 |
| 11 | 00001011 | 0011111001 | 0001101001 |
| 12 | 00001100 | 0011111100 | 0001101100 |
| 13 | 00001101 | 0100101111 | 0001110010 |
| 14 | 00001110 | 0100111011 | 0001111000 |
| 15 | 00001111 | 0100111110 | 0010000111 |
| 16 | 00010000 | 0101101011 | 0010001101 |
| 17 | 00010001 | 0101101110 | 0010010011 |
| 18 | 00010010 | 0101111010 | 0010010110 |
| 19 | 00010011 | 0110001111 | 0010011001 |
| 20 | 00010100 | 0110011011 | 0010011100 |
| 21 | 00010101 | 0110011110 | 0010100101 |
| 22 | 00010110 | 0110100111 | 0010110001 |
| 23 | 00010111 | 0110101101 | 0010110100 |
| 24 | 00011000 | 0110110011 | 0011000011 |
| 25 | 00011001 | 0110110110 | 0011000110 |
| 26 | 00011010 | 0110111001 | 0011001001 |
| 27 | 00011011 | 0110111100 | 0011001100 |
| 28 | 00011100 | 0111001011 | 0011010010 |
| 29 | 00011101 | 0111001110 | 0011011000 |
| 30 | 00011110 | 0111011010 | 0011100001 |
| 31 | 00011111 | 0111100011 | 0011100100 |
| 32 | 00100000 | 0111100110 | 0011110000 |
| 33 | 00100001 | 0111101001 | 0100001011 |
| 34 | 00100010 | 0111101100 | 0100001110 |
| 35 | 00100011 | 0111110010 | 0100011010 |
| 36 | 00100100 | 0111111000 | 0100100011 |
| 37 | 00100101 | 0011011110 | 0100100110 |
| 38 | 00100110 | 1000110111 | 0100101001 |
| 39 | 00100111 | 1000111101 | 0100101100 |
| 40 | 00101000 | 1001001111 | 0100110010 |
| 41 | 00101001 | 1001011011 | 0100111000 |
| 42 | 00101010 | 1001011110 | 0101001010 |
| 43 | 00101011 | 1001100111 | 0101100010 |
| 44 | 00101100 | 1001101101 | 0101101000 |
| 45 | 00101101 | 1001110011 | 0110000011 |
| 46 | 00101110 | 1001110110 | 0110000110 |
| 47 | 00101111 | 1001111001 | 0110001001 |
| 48 | 00110000 | 1001111100 | 0110001100 |
| 49 | 00110001 | 1010010111 | 0110010010 |
| 50 | 00110010 | 1010011101 | 0110011000 |
| 51 | 00110011 | 1010110101 | 0110100001 |
| 52 | 00110100 | 1011000111 | 0110100100 |
| 53 | 00110101 | 1011001101 | 0110110000 |
| 54 | 00110110 | 1011010011 | 0111000010 |
| 55 | 00110111 | 1011010110 | 0111001000 |
| 56 | 00111000 | 1011011001 | 0111100000 |
| 57 | 00111001 | 1011011100 | 1000000111 |
| 58 | 00111010 | 1011100101 | 1000001101 |
| 59 | 00111011 | 1011110001 | 1000010011 |
| 60 | 00111100 | 1011110100 | 1000010110 |
| 61 | 00111101 | 1100001111 | 1000011001 |
| 62 | 00111110 | 1100011011 | 1000011100 |
| 63 | 00111111 | 1100011110 | 1000100101 |
| 64 | 01000000 | 1100100111 | 1000110100 |
| 65 | 01000001 | 1100101101 | 1000110100 |
| 66 | 01000010 | 1100110011 | 1001000011 |
| 67 | 01000011 | 1100110110 | 1001000110 |
| 68 | 01000100 | 1100111001 | 1001001001 |
| 69 | 01000101 | 1100111100 | 1001001100 |
| 70 | 001000110 | 1101001011 | 1001010010 |
| 71 | 01000111 | 1101001110 | 1001011000 |
| 72 | 01001000 | 1101011010 | 100110001 |
| 73 | 01001001 | 1101100011 | 1001100100 |
| 74 | 01001010 | 1101100110 | 1001110000 |

TABLE 2-continued

MB810 Decoding code-book

| | | | |
|---|---|---|---|
| 75 | 01001011 | 1101101001 | 1010000101 |
| 76 | 01001100 | 1101101100 | 1010010001 |
| 77 | 01001101 | 1101110010 | 1010010100 |
| 78 | 01001110 | 1101111000 | 1011000001 |
| 79 | 01001111 | 1110000111 | 1011000100 |
| 80 | 01010000 | 1110001101 | 1011010000 |
| 81 | 01010001 | 1110010011 | 1100000011 |
| 82 | 01010010 | 1110010110 | 1100000110 |
| 83 | 01010011 | 1110011001 | 1100001001 |
| 84 | 01010100 | 1110011100 | 1100001100 |
| 85 | 01010101 | 1110100101 | 1100010010 |
| 86 | 01010110 | 1110110001 | 1100011000 |
| 87 | 01010111 | 1110110100 | 1100100010 |
| 88 | 01011000 | 1111000011 | 1100100100 |
| 89 | 01011001 | 1111000110 | 1100110000 |
| 90 | 01011010 | 1111001001 | 1101000010 |
| 91 | 01011011 | 1111001100 | 1101001000 |
| 92 | 01011100 | 1111010010 | 1110010000 |
| 93 | 01011101 | 4111011000 | 1110000001 |
| 94 | 01011110 | 1100011000 | 1110000100 |
| 95 | 01011111 | 1110100001 | 1101100001 |
| 96 | 01100000 | 1110100100 | 1101100100 |
| 97 | 01100001 | 1110110000 | 1101110000 |
| 98 | 01100010 | 1111000010 | 1110000101 |
| 99 | 01100011 | 1111001000 | 1110010001 |
| 100 | 01100100 | 0000101111 | 1110010100 |
| 101 | 01100101 | 0000111011 | 0000110111 |
| 102 | 01100110 | 0000111110 | 0000111101 |
| 103 | 01100111 | 0001101011 | 0001001111 |
| 104 | 01101000 | 0001101110 | 0001011011 |
| 105 | 01101001 | 0001111010 | 0001011110 |
| 106 | 01101010 | 0010001111 | 0001100111 |
| 107 | 01101011 | 0010011011 | 0001101101 |
| 108 | 01101100 | 0010011110 | 0001110011 |
| 109 | 01101110 | 0010101101 | 1111000001 |
| 110 | 01101101 | 0010100111 | 1111000100 |
| 111 | 01101111 | 0010110011 | 1111010000 |
| 112 | 01110000 | 0010110110 | 0001110110 |
| 113 | 01110001 | 0010111001 | 0001111001 |
| 114 | 01110010 | 0010111100 | 0001111100 |
| 115 | 01110011 | 0011001011 | 0010010111 |
| 116 | 01110100 | 0011001110 | 0010011101 |
| 117 | 01110101 | 0011011010 | 0010110101 |
| 118 | 01110110 | 0011100011 | 0011000111 |
| 119 | 01110111 | 0011100110 | 0011001101 |
| 120 | 01111000 | 0011101001 | 0011010011 |
| 121 | 01111001 | 0011101100 | 0011010110 |
| 122 | 01111010 | 0011110010 | 0011011001 |
| 123 | 01111011 | 0011111000 | 0011011100 |
| 124 | 01111100 | 0100101011 | 0011100101 |
| 125 | 01111101 | 0100101110 | 0011110100 |
| 126 | 01111110 | 0100111010 | 0011110100 |
| 127 | 01111111 | 0101101010 | 0100001111 |
| 128 | 10000000 | 0110001011 | 0100011011 |
| 129 | 10000001 | 0110001110 | 0100011110 |
| 130 | 10000010 | 0110011010 | 0100100111 |
| 131 | 10000011 | 0110100011 | 0100101101 |
| 132 | 10000100 | 0110100110 | 0100110011 |
| 133 | 10000101 | 0110101001 | 0100110110 |
| 134 | 10000110 | 0110101100 | 0100111001 |
| 135 | 10000111 | 0110110010 | 0100111100 |
| 136 | 10001000 | 0110111000 | 0101001011 |
| 137 | 10001001 | 0111001010 | 0101001110 |
| 138 | 10001010 | 0111100010 | 0101011010 |
| 139 | 10001011 | 0111101000 | 0101100011 |
| 140 | 10001100 | 1000001111 | 0101100110 |
| 141 | 10001101 | 1000011011 | 0101101001 |
| 142 | 10001110 | 1000011110 | 0101101100 |
| 143 | 10001111 | 1000100111 | 0101110010 |
| 144 | 10010000 | 1000101101 | 0101111000 |
| 145 | 10010001 | 1000110011 | 0110000111 |
| 146 | 10010010 | 1000110110 | 0110001101 |
| 147 | 10010011 | 1000111001 | 0110010011 |
| 148 | 10010100 | 1000111100 | 0110010110 |
| 149 | 10010101 | 1001001011 | 0110011001 |
| 150 | 10010110 | 1001001110 | 0110011100 |
| 151 | 10016111 | 1001011010 | 0110100101 |

TABLE 2-continued

MB810 Decoding code-book

| | | | |
|---|---|---|---|
| 152 | 10011000 | 1001100011 | 0110110001 |
| 153 | 1001101 | 1001100110 | 0110110100 |
| 154 | 10011010 | 1001101001 | 0111000011 |
| 155 | 10011011 | 1001101100 | 0111000110 |
| 156 | 10011100 | 1001110010 | 0111001001 |
| 157 | 10011101 | 1001111000 | 0111001100 |
| 158 | 10011110 | 1010000111 | 0111010010 |
| 159 | 10011111 | 1010001101 | 0111011000 |
| 160 | 10100000 | 1010010011 | 0111100001 |
| 161 | 10100001 | 1010010110 | 0111100100 |
| 162 | 10100010 | 1010011001 | 0111110000 |
| 163 | 10100011 | 1010011100 | 1000010111 |
| 164 | 10100100 | 1010100101 | 1000011101 |
| 165 | 10100101 | 1010110001 | 1000110101 |
| 166 | 10100110 | 1010110100 | 1001000111 |
| 167 | 10100111 | 1011000011 | 1001001101 |
| 168 | 10101000 | 1011000110 | 1001010011 |
| 169 | 10101001 | 1011001001 | 1001010110 |
| 170 | 10101010 | 1011001100 | 1001011001 |
| 171 | 10101011 | 1011010010 | 1001011100 |
| 172 | 10101100 | 1011011000 | 1001100101 |
| 173 | 10101101 | 1011100001 | 1001110001 |
| 174 | 10101110 | 1011100100 | 1001110100 |
| 175 | 10101111 | 1011110000 | 1010010101 |
| 176 | 10110000 | 1100001011 | 1011000101 |
| 177 | 10110001 | 1100001110 | 1011010001 |
| 178 | 10110010 | 1100011010 | 1011010100 |
| 179 | 10110011 | 1100100011 | 1100000111 |
| 180 | 10110100 | 1100100110 | 1100001101 |
| 181 | 10110101 | 1100101001 | 1100010011 |
| 182 | 10110110 | 1100101100 | 1100010110 |
| 183 | 10110111 | 1100110010 | 1100011001 |
| 184 | 10111000 | 1100111000 | 1100011100 |
| 185 | 10111001 | 1101001010 | 1100100101 |
| 186 | 10111010 | 1101100010 | 1100110001 |
| 187 | 10111011 | 1101101000 | 1100110100 |
| 188 | 10111100 | 1110000011 | 1101000011 |
| 189 | 10111101 | 1110000110 | 1101000110 |
| 190 | 10111110 | 1110001001 | 1101001001 |
| 191 | 10111111 | 1110001100 | 1101001100 |
| 192 | 11000000 | 1110010010 | 1101010010 |
| 193 | 11000001 | 1110011000 | 1101011000 |

| NO | Output | Received symbol | | | |
|---|---|---|---|---|---|
| 194 | 11000010 | 0011101111 | 1001000001 | 0010100110 | 0100111101 |
| 195 | 11000011 | 0011111011 | 1001000100 | 0010101001 | 0001110111 |
| 196 | 11000100 | 1111011010 | 1001010000 | 0010101100 | 0101011011 |
| 197 | 11000101 | 0110101111 | 0000100101 | 0010110010 | 0101011110 |
| 198 | 11000110 | 0110111011 | 0000110001 | 0010111000 | 0101100111 |
| 199 | 11000111 | 0110111110 | 0000110100 | 0011001010 | 0101101101 |
| 200 | 11001000 | 0111101011 | 0001000011 | 0011100010 | 0101110011 |
| 201 | 11001001 | 0111101110 | 0001000110 | 0010100011 | 0100110111 |
| 202 | 11001010 | 0111111010 | 0001001001 | 0010011010 | 0001111101 |
| 203 | 11001011 | 1001101111 | 0001001100 | 0011101000 | 0101110110 |
| 204 | 11001100 | 1001111011 | 0001010010 | 0100101010 | 0101111001 |
| 205 | 11001101 | 1001111110 | 0001100001 | 1100101000 | 1101100101 |
| 206 | 11001110 | 1010110111 | 0001100100 | 1100001010 | 1101110001 |
| 207 | 11001111 | 1010111101 | 0001011000 | 1100100010 | 1101110100 |
| 208 | 11010000 | 1101111010 | 0100100100 | 1001101000 | 1001011101 |
| 209 | 11010001 | 1110001111 | 0100110000 | 1110001000 | 1001110101 |
| 210 | 11010010 | 1110011011 | 0101000010 | 1010000110 | 1011010101 |
| 211 | 11010011 | 1110011110 | 0101001000 | 1010001001 | 1100010101 |
| 212 | 11010100 | 1110100111 | 0101100000 | 1010001100 | 1100011101 |
| 213 | 11010101 | 1110101101 | 0110000001 | 1010010010 | 1100110101 |
| 214 | 11010110 | 1110110011 | 0110000100 | 1010011000 | 1101000111 |
| 215 | 11010111 | 1110110110 | 0110010000 | 1010100010 | 1101001101 |
| 216 | 11011000 | 1110111001 | 1100010000 | 1010100100 | 1101010011 |
| 217 | 11011001 | 1011001111 | 1100000100 | 0110001010 | 0011010111 |
| 218 | 11011010 | 1011011011 | 0010000101 | 0110100010 | 0110010111 |
| 219 | 11011011 | 1011011110 | 0010010001 | 0110101000 | 0110011101 |
| 220 | 11011100 | 1011100111 | 0010010100 | 1011000010 | 0110110110 |
| 221 | 11011101 | 1011101101 | 0011000001 | 1011001000 | 0111000111 |
| 222 | 11011110 | 1011110011 | 0011000100 | 1000011010 | 0111001101 |
| 223 | 11011111 | 1011110110 | 0011010000 | 1000100011 | 0111010011 |
| 224 | 11100000 | 1011111001 | 0100000011 | 1000100110 | 0111010110 |
| 225 | 11100001 | 1011111100 | 0100000110 | 1000101001 | 0111011001 |

TABLE 2-continued

MB810 Decoding code-book

| 226 | 11100010 | 1100101111 | 0100001001 | 1000101100 | 0111011100 |
| 227 | 11100011 | 1100111011 | 0100001100 | 1000110010 | 0111100101 |
| 228 | 11100100 | 1100111110 | 0100010010 | 1000111000 | 0011011101 |
| 229 | 11100101 | 1101101011 | 0100011000 | 1001001010 | 0111110100 |
| 230 | 11100110 | 1101101110 | 0100100001 | 1001100010 | 1001010111 |
| 231 | 11100111 | 1110111100 | 1000000101 | 0001101010 | 1110010101 |

What is claimed is:

1. A coding method for converting m-bit input data into an n-bit codeword, comprising:

selecting the number of input bits m and the number of output bits n for an (m,n) block code;

accumulating a sufficient number of BUDA (binary unit DSV and ASV) cells to form a BUDA stack for derivation of a state diagram;

picking one node as a state, and securing at least $2^m$ exit paths of an n-hop length, and denoting each terminating node of each path as another state;

starting with a new state and repeating the previous step;

if it turns out that the stack needs to be expanded to complete the state diagram, adding more cells to the stack either horizontally or vertically as appropriate;

reducing the number of states as possible with all transition paths terminating on one of the arranged states;

at each state, arranging the mapping table as an input m-bit combination to an output n-bit combination; and, as necessary, plotting the power spectrum of the coded sequence with varying input bit probability, and choosing the mapping that would generate the most desirable power spectral properties.

2. The coding method of claim 1, wherein an RAS is obtained by the following equation:

$$RAS = \sum_{n=I}^{J} (-1)^n Y_n$$

where I and J are integers, I<J, and $Y_n$ represents a codeword.

3. The coding method of claim 1, wherein an RDS is obtained by the following equation:

$$RDS = \sum_{n=I}^{J} Y_n$$

where I and J are integers, I<J, and $Y_n$ represents a codeword.

4. The coding method of claim 1, wherein an RDS is obtained by the following equation:

$$DSV = \max_{I,J,\{Y_n\}} \left| \sum_{n=I}^{J} Y_n \right|$$

where I and J are integers, I<J, and $Y_n$ represents a codeword.

5. The coding method of claim 1, wherein an ASV is obtained by the following equation:

$$ASV = \max_{I,J,\{Y_n\}} \left| \sum_{n=I}^{J} (-1)^n Y_n \right|$$

where I and J are integers, I<J and $Y_n$ represents a codeword.

6. A method for converting m-bit input data into an n-bit codeword, comprising:

receiving input data and generating a serial data stream, the serial data stream having frame-word for synchronization;

converting the serial data stream into a parallel data stream;

storing a plurality of codewords and a plurality of input date into an encoding table, the codewords being obtained by:

selecting the number of input bits m and the number of output bits n for an (m,n) block code;

accumulating a sufficient number of BUDA (binary unit DSV and ASV) cells to form a BUDA stack for derivation of a state diagram;

picking one node as a state, and securing at least $2^m$ exit paths of an n-hop length, and denoting each terminating node of each path as another state;

starting with a new state and repeating previous step;

if it turns out that the stack needs to be expanded to complete the state diagram, adding more cells to the stack either horizontally or vertically as appropriate;

reducing the number of states as possible with all transition paths terminating on one of the arranged states;

at each state, arranging the mapping table as an input m-bit combination to an output n-bit combination; and, as necessary, plotting the power spectrum of the coded sequence with varying input bit probability, and choosing the mapping that would generate the most desirable power spectral properties;

looking up said encoding table and searching for a parallel codeword, and pairing the parallel codeword with the input data; and converting the parallel codeword into a serial codeword.

7. The encoding apparatus of claim 6, wherein said parallel-serial conversion means converts the parallel data stream into the serial data stream by an interleaving technique.

8. The encoding apparatus of claim 6, wherein said encoding clock generating means uses a phase lock loop technique.

9. A method for converting an n-bit codeword into an x m-bit input data, comprising:

recovering a system clock signal and latching a serial codeword;

generating an enable signal when a frame-word codeword is detected from the serial codeword;

converting the serial codeword into a parallel codeword when the enable signal is generated;

storing a plurality of codewords and a plurality of input data in a decoding table, the codewords being obtained by:

selecting the number of input bits m and the number of output bits n for an (m,n) block code;

accumulating a sufficient number of BUDA (binary unit DSV and ASV) cells to from a BUDA stack for derivation of a state diagram;

picking one node as a state, and securing at least $2^m$ exit paths of an n-hop length, and denoting each terminating node of each path as another state;

starting with a new state and repeating previous step;

if it turns out that the stack needs to be expanded to complete the state diagram, adding more cells to the stack either horizontally or vertically as appropriate;

reducing the number of states as possible with all transition paths terminating on one of the arranged states;

at each state, arranging the mapping table as an input m-bit combination to an output n-bit combination; and, as necessary, plotting the power spectrum of the coded sequence with varying input bit probability, and choosing the mapping that would generate the most desirable power spectral properties;

receiving said parallel codeword and looking up a decoding table to search for a parallel data stream, and pairing the parallel data stream with the parallel codeword;

converting the parallel data stream into a serial data stream; and receiving the serial data stream, detecting a frame-word, and generating an input data stream.

10. The decoding apparatus of claim 9, wherein said parallel-serial conversion means converts the parallel data stream into the serial data stream by an interleaving technique.

11. The decoding apparatus of claim 9, wherein said decoding clock generating means uses a phase lock loop technique.

12. The decoding apparatus of claim 9, wherein said codeword synchronization means comprises:

RAS, RDS calculation means for calculating RAS and RDS of the serial codeword, comparing the RAS and RDS of the serial codeword with the RAS and RDS of a specification, and generating an enable or a disable signal, the enable signal generated when the RAS and the RDS of the serial codeword is smaller than the RAS and the RDS of the specification, the disable signal generated when the RAS and RDS of the serial codeword is bigger than the RAS and RDS of the specification;

a plurality of D flip-flops for latching the serial codeword;

frame-word detection means for comparing the serial codeword with a frame-word codeword and generating an enable signal or a disable signal, the enable signal generated when the frame-word codeword is detected more than three times periodically; and an AND gate configured to generate an enable signal when both said RAS, RDS calculation means and said frame-word detection means generate the enable signal.

13. The decoding apparatus of claim 12, wherein the RAS is obtained by the following equation:

$$RAS = \sum_{n=I}^{J} (-1)^n Y_n$$

where I and J are integers, I<J, and $Y_n$ represents a codeword.

14. The decoding apparatus of claim 12, wherein the RDS is obtained by the following equation:

$$RDS = \sum_{n=I}^{J} Y_n$$

where I and J are integers, I<J, and $Y_n$ represents a codeword.

* * * * *

UNITED STATES PATENT AND TRADEMARK OFFICE
CERTIFICATE OF CORRECTION

PATENT NO.    : 6,362,757 B1
DATED         : March 26, 2002
INVENTOR(S)   : Changoo Lee et al.

It is certified that error appears in the above-identified patent and that said Letters Patent is hereby corrected as shown below:

Column 24,
Line 27, "date into an encoding table," should read -- data into an encoding table --.
Line 62, "codeword into anx" should read -- codeword into an --.

Column 25,
Line 9, "DSV and ASV) cells to from" should read -- DSV and ASV) cells to form --.

Signed and Sealed this

Second Day of July, 2002

Attest:

Attesting Officer

JAMES E. ROGAN
Director of the United States Patent and Trademark Office